United States Patent [19]

Bolan et al.

[11] Patent Number: 6,092,071

[45] Date of Patent: Jul. 18, 2000

[54] DEDICATED INPUT/OUTPUT PROCESSOR METHOD AND APPARATUS FOR ACCESS AND STORAGE OF COMPRESSED DATA

[75] Inventors: Joseph Edward Bolan, Vestal, N.Y.; Brian Eldridge Clark, Rochester, Minn.; Gregory Robert Klouda, Endwell, N.Y.; Bruce Marshall Walk, Rochester, Minn.

[73] Assignee: International Business Machines Corporation, Armonk, N.Y.

[21] Appl. No.: 08/964,292

[22] Filed: Nov. 4, 1997

[51] Int. Cl.[7] .................................................. G06F 13/00
[52] U.S. Cl. ........................................... 707/101; 707/204
[58] Field of Search .................................... 707/200–206; 710/66, 68; 711/202–20

[56] References Cited

U.S. PATENT DOCUMENTS

| | | | |
|---|---|---|---|
| 4,467,421 | 8/1984 | White ........................................ | 364/200 |
| 5,155,835 | 10/1992 | Belsan ...................................... | 395/425 |
| 5,237,675 | 8/1993 | Hannon, Jr. .............................. | 395/425 |
| 5,247,638 | 9/1993 | O'Brien et al. .......................... | 395/425 |
| 5,247,646 | 9/1993 | Osterlund et al. ....................... | 395/425 |
| 5,276,867 | 1/1994 | Kenley et al. ............................ | 395/600 |
| 5,305,295 | 4/1994 | Chu ........................................... | 369/30 |
| 5,319,793 | 6/1994 | Hancock et al. ......................... | 395/800 |
| 5,357,614 | 10/1994 | Pattisam et al. ......................... | 395/250 |
| 5,481,701 | 1/1996 | Chanbers, IV ........................... | 395/600 |
| 5,537,658 | 7/1996 | Bakke et al. ............................. | 710/68 |
| 5,623,701 | 4/1997 | Bakke et al. ............................. | 710/68 |
| 5,666,560 | 9/1997 | Moertl et al. ............................. | 710/68 |
| 5,675,789 | 10/1997 | Ishii et al. ................................ | 707/204 |
| 5,682,499 | 10/1997 | Bakke et al. ............................. | 711/112 |
| 5,684,986 | 11/1997 | Moertl et al. ............................. | 707/101 |
| 5,696,927 | 12/1997 | MacDonald et al. .................... | 711/207 |
| 5,765,204 | 6/1998 | Bakke et al. ............................. | 711/202 |
| 5,813,011 | 9/1998 | Yoshida et al. .......................... | 707/101 |

OTHER PUBLICATIONS

J. E. Chan, et al., "Conditional Least–Recently–Used Data Cache Design to Support Multimedia Applications". *IBM Technical Disclosure Bulletin,* vol. 37, No. 02B, Feb. 1994, pp. 387–389.

*Primary Examiner*—Christopher B. Shin
*Attorney, Agent, or Firm*—Shelley M Beckstrand

[57] ABSTRACT

System control of compression and decompression of data based upon system aging parameters, such that compressed data becomes a system managed resource with a distinct place in the system storage hierarchy. Processor registers are backed by cache, which is backed by main storage, which is backed by decompressed disk storage, which is backed by compressed disk storage then tape, and so forth. Data is moved from decompressed to compressed form and migrated through the storage hierarchy under system control according to a data life cycle based on system aging parameters or, optionally, on demand: data is initially created and stored; the data is compressed at a later time under system control; when the data is accessed, it is decompressed on demand by segment; at some later time, the data is again compressed under system control until next reference. Large data objects are segmented and compression is applied to more infrequently used data. A dedicated compression input/output processor (IOP) is controlled by host system defined data structures which include a bus transport mechanism (BTM) which is DMA loaded to the compression IOP storage. The BTM includes a request response control block (RRCB) comprising a compress or decompress operation command, a data out descriptor (DOD) for providing the address of data in host storage that needs to be compressed or decompressed, and data in descriptor (DID) for providing the address in host storage where the resulting decompressed or compressed data is to be stored.

9 Claims, 12 Drawing Sheets

COMPRESSION RRCB

DECOMPRESSION RRCB

DEDICATED INPUT/OUTPUT PROCESSOR METHOD AND APPARATUS FOR ACCESS AND STORAGE OF COMPRESSED DATA

BACKGROUND OF THE INVENTION

1. Technical Field of the Invention

This invention relates to system management of data. More particularly, it relates to system control of compression and decompression of data based upon system aging parameters and demand such that compressed data becomes a system managed resource.

2. Background Art

In the interactive commercial business environment, data sets are often very large. One example of this is databases, which may be spread over several storage devices, such as direct access storage devices (DASD), on several DASD controllers and increasingly over several interconnected machines.

More efficient use may be made of storage attached to a computer if data can be compressed before it is stored. Multi-fold compression ratios can be achieved with algorithms currently available for some data set contents. Often, frequent access is limited to some subsets of these data sets, and further to certain subsets of the data set itself. Data sets of the size common on commercial business machines render full file based data compression such as 'terse' unacceptable for anything other than long-term archives. Furthermore occasional usage requires the entire dataset be decompressed at first access. The commercial business environment is highly interactive. To be of value, data must be made available on demand without manual intervention.

Also, in the IBM AS/400 System, compression is offered with all functions provided by software. Such software compression allows for the compression of objects with performance in the 70–80 thousand (K) byte range. There is a need in the art for hardware compression to enhance and extend compression to database, office, and spool files.

It is an object of the invention to provide a practical method to segment large files and perform efficient compression. It is a further object of the invention to apply compression more efficiently to large databases, portions of which may be used more frequently than others.

It is a further object of the invention to provide a system and method for managing data, with compressed data managed as a system resource based upon aging and demand.

SUMMARY OF THE INVENTION

A system for controlling modification of a data object includes a host processor, a main storage, a remote storage and a data modification input/output processor (IOP). Responsive selectively to an application request for a data object which has previously been modified, or to a system defined parameter, such as age of a data object since creation or modification, the host processor stores in said main storage a data object selectively from said remote storage via a bus transport mechanism (BTM). The BTM includes a modification operation command, a data out descriptor (DOD) for addressing the location in said main storage of the data object that needs to be modified, and a data in descriptor (DID) for addressing the location in said main storage where the resulting modified data object is to be stored. The modification IOP utilizes the BTM and executes the modification command to modify and return the data object to main storage.

In accordance with a further aspect of the invention, data object modification selectively is data object compression and data object decompression. In accordance with a further aspect of the invention, data objects may be divided into subcomponents and compressed or decompressed on a subcomponent basis.

Other features and advantages of this invention will become apparent from the following detailed description of the presently preferred embodiment of the invention, taken in conjunction with the accompanying drawings.

BEST MODE FOR CARRYING OUT THE INVENTION

In accordance with this invention, large files are segmented and compression is applied to more infrequently used data. Compressed data becomes a system managed resource with a distinct place in the system storage hierarchy. Processor registers are backed by cache, which is backed by main storage, which is backed by decompressed disk storage, which is backed by compressed disk storage then tape, and so forth. Data is moved from decompressed to compressed form based on system aging parameters or, optionally, on demand.

In one preferred embodiment, data compression is controlled in 16 megabyte (MB) segments. Compression status is maintained on each of these segments (also referred to as subcomponents) of a larger data set. When compressed data is requested, only 16 MB must be decompressed before it is useable. If no other segments of the data set are requested by the system, no other segments are decompressed. Similarly, portions of a data set rarely used will be compressed, while other portions, if used frequently, will remain decompressed.

In accordance with this invention, data is automatically migrated through the storage hierarchy under system control, assuming the following data life cycle. Data is initially created and stored. At some later point the data is compressed under system control via an aging algorithm. When the data is accessed, it is decompressed on demand by segment. At some later point in time, the data is again compressed under system control until next reference.

By compression under direct system control is meant the compression of data in accordance with a system managed algorithm, such as an aging algorithm, as distinguished from compression upon demand by human intervention. In accordance with the invention, data modification preferably selectively includes compression and/or decompression of data objects or subcomponents.

Figure 1:
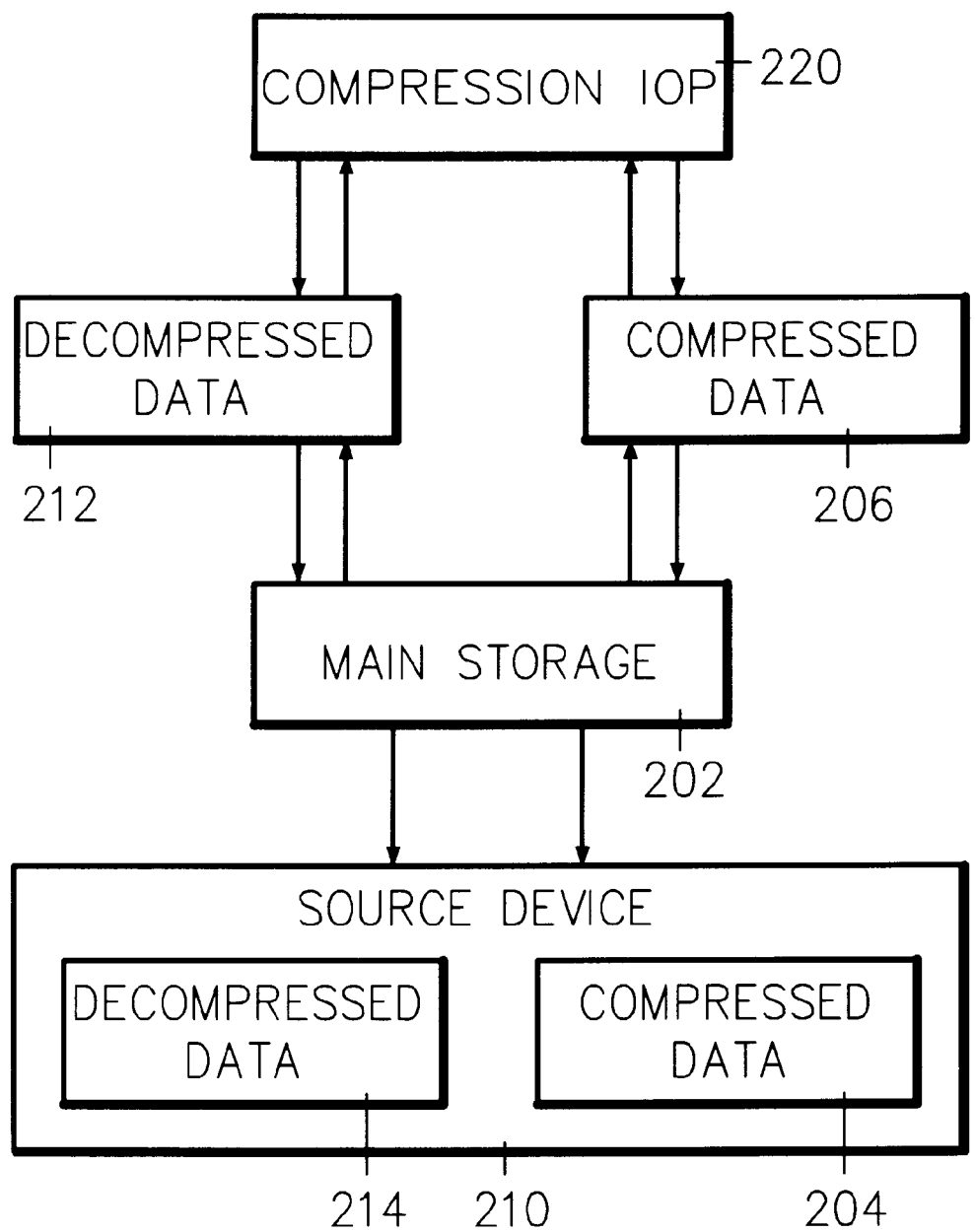
FIG. 1 is a system diagram illustrating the data paths for compression and decompression.
Figure 2:
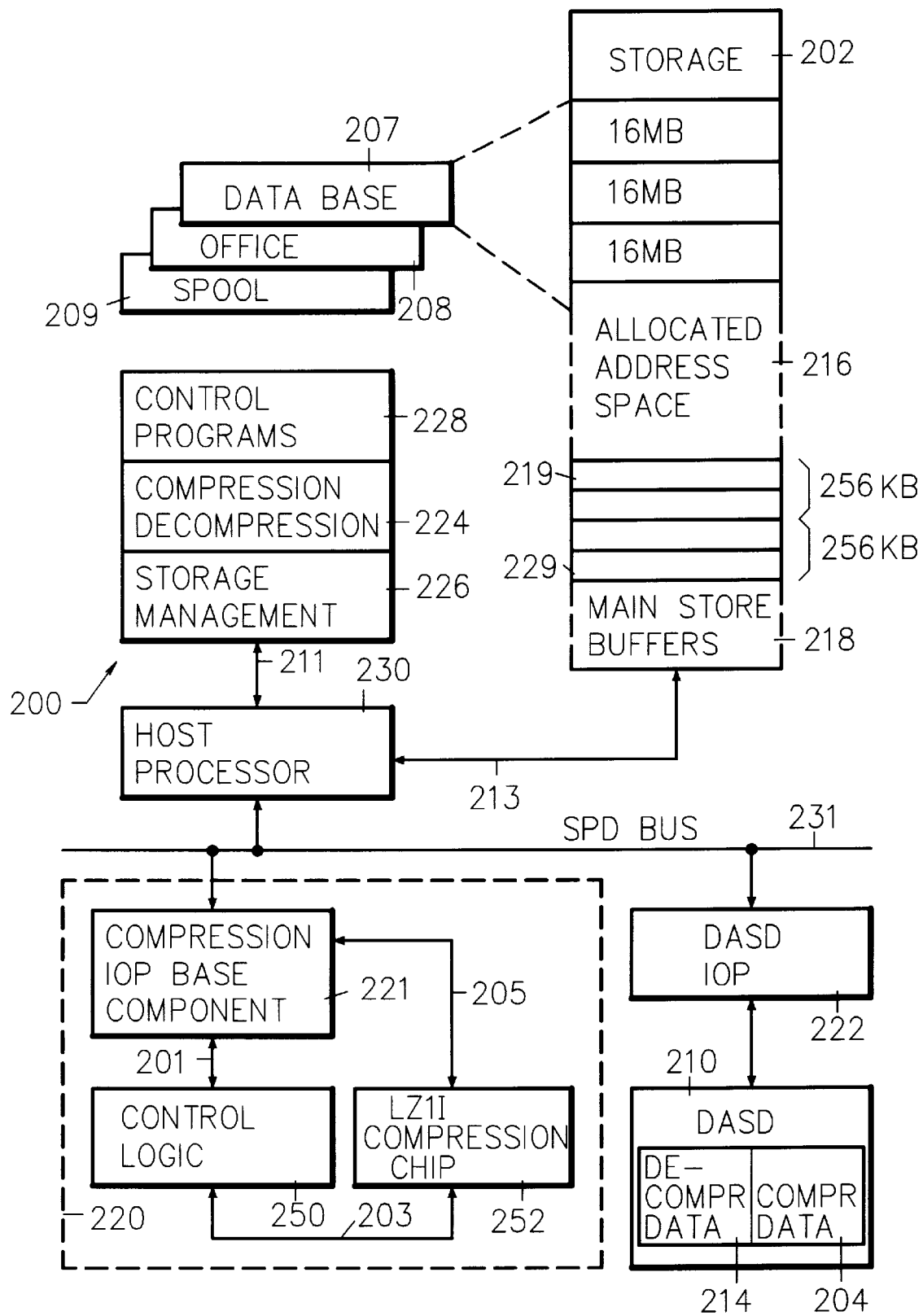
FIG. 2 is a system diagram illustrating the compression/decompression system of the invention.

Referring to FIG. 2 in connection with FIG. 1, further in accordance with this invention, data compression is via a dedicated outboard I/O processor (IOP) 220, which serves as compression accelerator hardware, with no direct access to disk storage 210. Data 204 from source device 210 to be decompressed is transferred from main storage 202 as compressed data 204 to compression accelerator hardware 220, and back as decompressed data 212 to main storage 202. Movement of the decompressed data 214 to disk storage 210 is then completed under storage management 226 control. A similar process, in reverse, is executed to move uncompressed data from source device 210 through storage 202 to compression IOP 220 for compression, and to return it through main storage 202 to source device 210 as compressed data.

Thus, in accordance with this invention, data compression I/O processor 220 and associated control code is added to a typical system to improve system response time during data compression and decompression operations. Data compression I/O processor 220 has no direct connection to backing storage 210, but receives data from main storage 202, compresses or decompresses the data based on the system command received, and returns the modified data to main storage 202.

The stimulus to compress comes from one of the following three places:

(1) CPROBJ—compress object—immediate command
(2) CPROBJ—compress object—based on time elapsed since reference
(3) Re-compressing a block of data that has been decompressed and modified.

The stimulus to decompress comes whenever access to data within a compressed object or database segment is requested, such as by an application. compression occurs on 16 MB address segments, whereas the amount of data to be compressed can range from 1 to 16 MB. Decompression occurs on the same 16 MB address segments.

As used herein, an object is a named unit that comprises a given set of characteristics that describe the object and in some cases the data. An object is anything that exists in and takes space in storage and on which operations can be performed. Examples of objects include programs, files, libraries, and folders.

In this preferred embodiment of the invention, compression is performed on objects and data within 16 megabyte (MB) segments. All data within the segment is either compressed or not compressed. Data gets compressed directly under operator control or indirectly under programmed control using an aging algorithm, such as "time since access", to determine infrequently used data. For example, the granularity for the aging algorithm may be any period, such as days, hours or weeks. Similarly, when any data within a 16 MB segment is required, all data within that segment is decompressed.

The compression algorithm has control parameters that enable compression to be done on a file basis on demand or let the system do it—moreover to do compression on, for example, a 16 MB segment of the file, thus controlling that part of the file which is compressed while other parts are left uncompressed. The system knows which part of a file is compressed, and which part is uncompressed or decompressed. Responsive to a user application program request to access a location in a file, the system gets and, if needed, decompresses it.

Referring to FIG. 2, the compression/decompression system of the invention will be described. System 200 (also referred to as CPU or host) includes processor 230 connected to main storage 202 over internal bus 213, and to control programs 228 over bus 211. In accordance with the preferred embodiment, in the IBM AS/400 system, control programs 228 and data storage 216, 218, 219, 229 all coexist in main store 202. Control programs 228 include storage management 226 and compression and decompression control programs 224. Storage 202 includes a plurality of 256 kilobyte (KB) main store buffers 218–219, and allocated address space 216 which includes several 16 megabyte (MB) allocated address space areas 216 for data base files 207, office files 208, spool files 209, and the like.

Host processor 230 is connected via system I/O bus 231, such as an SPD bus, to compression IOP 220 and DASD IOP 222. DASD IOP 222 is connected to DASD 210. Compression IOP 220 includes compression IOP base components 221, control logic 250 and LZ1I compression chip 252 interconnected by busses 201, 203 and 205. In a preferred embodiment, LZ1I compression chip 252 is an IBM P/N 50G3745 chip, and compression IOP base 221 contains an industry standard 80960 CA microprocessor and attaches to custom chip 250 over a 2-byte wide magnetic media bus 201, which chip 250 interfaces two four-byte wide LZ1I buses 203 and controls the actual compression logic LZ1I compression chip 252. Further, compression IOP base 221 interfaces the standard IBM SPD bus 231 used in the IBM AS/400 system. Data is passed from system 200 to compression IOP 220 over system bus 231 for compression/decompression and passed back to the system over the same system bus after the operation is complete. In this embodiment of the invention, main storage 202 is only accessible to compression IOP 220 over system bus 231, and no DASD storage 210 is directly accessible from compression IOP 220. In one embodiment of the invention, IOP base 221 is based on an AS/400 DASD IOP with SDC2 (SCSI) chips removed, vendor logic chips added to interface magnetic media bus 201, and a prior art LZ1I compression chip 252 added for the compression function.

In operation, when compression is required, VMC compression task 224 and storage management 226 do the following.

(1) Ensure that the data to be decompressed is in main-store 202.
(2) Break up the data into compressible entities (herein <128 KB) that can be sent to compression IOP 220.
(3) Issue, for each block of data, a compress command to compression IOP 220. This is similar to a write command followed by a read command for each block.

Compression IOP 220 then transfers data to its buffer space, routes it through compression chip 252, and returns the data back to mainstore 202 using data descriptors contained in the compress command. The compress command continues until all data has been compressed. Compression task 224 and storage management 226 then ensure that the compressed data is stored to DASD 210. Any involved applications are then notified of the completion in order to correctly indicate the status of this segment of data as compressed.

When decompression is required, VMC compression task 224 and storage management 226 do the following.

(1) Ensure that the data to be decompressed is routed in mainstore 202. This data will consist of a set of compressed blocks, the size of which vary depending on the efficiency of compression for that particular data.

(2) Issue a decompress command to compression IOP 220. This is similar to a write followed by a read for each block, and is done for each block of data.

Compression IOP 220 transfers data from mainstore 202 to its buffer space, through compression hardware 252 and back to mainstore 202. This continues until all data has been decompressed. Storage management 226 and compression task 224 then ensure that the decompressed data is managed normally. Any involved applications are notified of the completion of decompression in order to correctly indicate the status of this segment of data as decompressed.

It is the role of the control programs (VMC) 228, including compression task 224 and storage management task 226, to efficiently organize the flow of data into and out of compression input/output processor (IOP) 220. Compression IOP 220 is a dedicated engine that does not consume system cycles while handling compression and decompression under user control or under control of the aging algorithm at the system level. IOP base 221 is similar to, for example, I/O, or DASD, IOP 222.

In accordance with a preferred embodiment of the invention, operations to and from compression IOP 220 are limited to a maximum of 128 kilobytes (KB) of uncompressed data. When compressing data, this allows for the preservation of the original data in the event that little or no compression is achieved. In the event that data expands, IOP 220 detects this condition and responds with the appropriate status to storage management 226 while leaving the original data intact. VMC 228 must therefore divide the data into blocks with space reserved for the addition of headers required for the management and decompression of each block.

In a preferred embodiment, host processor 230 control program 228 is the IBM OS/400, a component of which is storage management 226, which component, together with compression and decompression control 224, contains code implementing the method of the invention.

Data is retrieved from DASD 210 into a main storage buffer 219 in the main storage buffer pool 218. Once present, a compress command (basically a write/read) is issued by control programs 228 to compression IOP 220 specifying the location of the data buffer 219 containing the uncompressed data as well as the location of the buffer 229 where the compressed data should be placed. Compression IOP 220 moves the data from buffer 219, through its compression hardware 252 and returns data to a second main storage buffer 229. Once the compressed data is present in a buffer 229, it will most likely be moved by storage management 226 in a routine fashion out to DASD 210. Decompression is the inverse of this operation.

Figure 3:
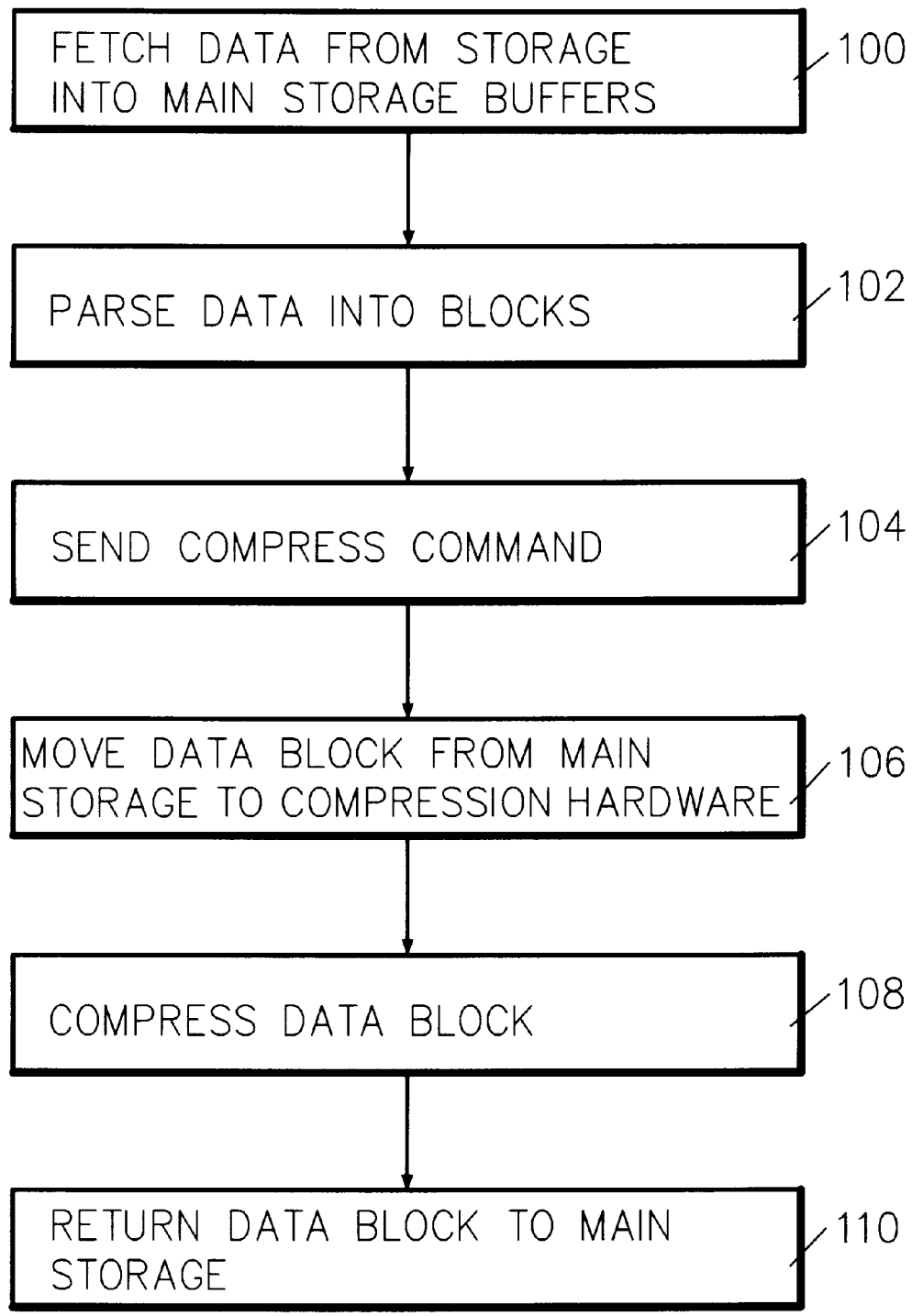
FIG. 3 is a high level flow diagram illustrating the compression method of the invention.

Referring to FIG. 3, the compression method of the invention is illustrated. Reasonable performance requires that an efficient buffer handling routine be used such that the flow of data is overlapped as much as possible. In step 100, uncompressed or decompressed data 214 is fetched from storage 210 and stored into main storage buffers 218. In step 102, data in buffer 218 is parsed into blocks. In step 104, compression control program 224 sends a compress command to compression IOP 220. In step 106, compression IOP 220 moves a data block from main storage 202 to compression hardware 252, which in step 108 compresses the data block. In step 110, the compressed data block is returned to main storage 202. Decompression is accomplished in a similar manner. A more detailed description of both compression and decompression will be provided hereafter in connection with FIGS. 8 and 9.

Figure 4:
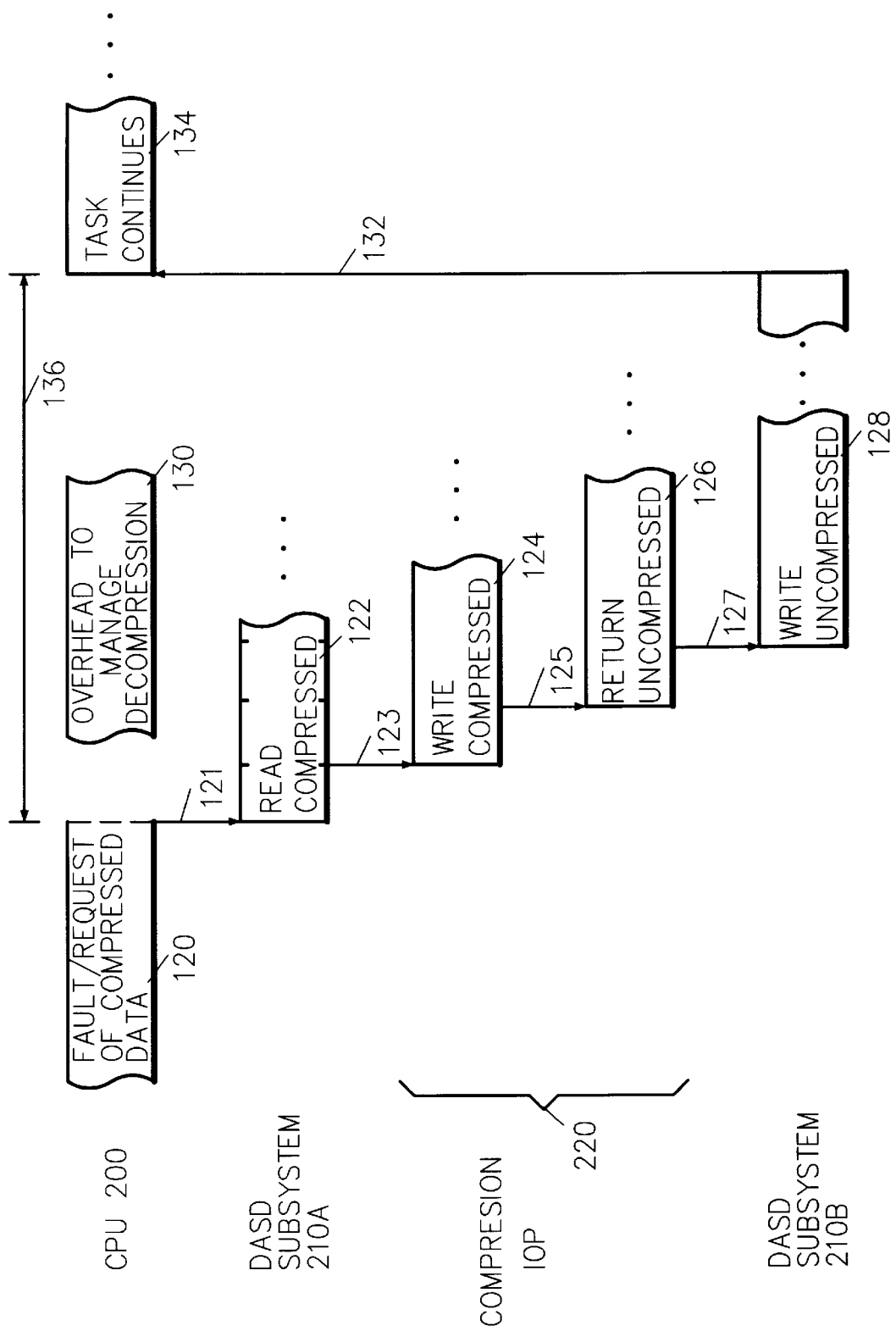
FIG. 4 is a timing diagram illustrating the response time for a read of compressed data.

Referring to FIG. 4, a timing and flow chart illustrates the decompression process of the invention. In step 120, CPU 200 receives a data fault (a request from an application program, for example, to a compressed data file residing in external storage 210, and as is represented by line 121 issues a read command to the DASD IOP 222 for subsystem 210A (one of DASD devices 210) containing the compressed file. In step 122 the compressed file is read from DASD subsystem 210A into storage buffers 218. In step 123, CPU 200 issues a write command to compression IOP, which in step 124 writes compressed data from storage buffers 218 to LZ1I compression chip. In step 125, compression IOP 220 develops decompressed data in LZ1I compression chip 252, and step in 126 returns decompressed data to a storage buffer 218. In step 127, CPU 200 issues a write uncompressed command to the DASD IOP 222 for subsystem 210B (another one of DASD devices 210), which in step 128 writes the uncompressed data to DASD subsystem 210B. Once the uncompressed data is written to subsystem 210B, at time, or step, 132 control returns to CPU 200 for continuing execution of the application task in step 134. Time 136 represents the response time for CPU 200 compression overhead 130 to read compressed data. At time 132, the desired data is in storage 202 and the segment on DASD 210B is uncompressed. In accordance with a preferred embodiment of the invention, for data integrity, uncompressed data must be on DASD 210B before task continues at step 134. However, in accordance with an alternative embodiment, with today's sophisticated memory management units, main task 134 begins to use decompressed data from step 126 at time 127, particularly in 'read-only' mode, requiring the write to DASD of step 128 to complete only in the case where the data is written or changed.

As noted above, DASD subsystem 210A represents the DASD arm containing the compressed data, and DASD subsystem 210B represents the DASD arm to which the uncompressed data segment is output. Alternatively, DASD subsystems 210A and 210B may to different sets of blocks in the same subsystem.

Steps 122, 124, 126, 128 operate on data blocks equal to or less than 16 MB. Step 122 reads compressed data into main storage 202 from DASD subsystem 210A in 256 KB data transfers. Step 124 writes compressed data from main storage 202 to the compression IOP in 128 KB data transfers. Step 126 returns data from the compression IOP 220 to main memory in 128 KB data transfers. Step 128 write uncompressed data from main storage 202 to DASD subsystem 210B in 256 KB data transfers.

Figure 5:
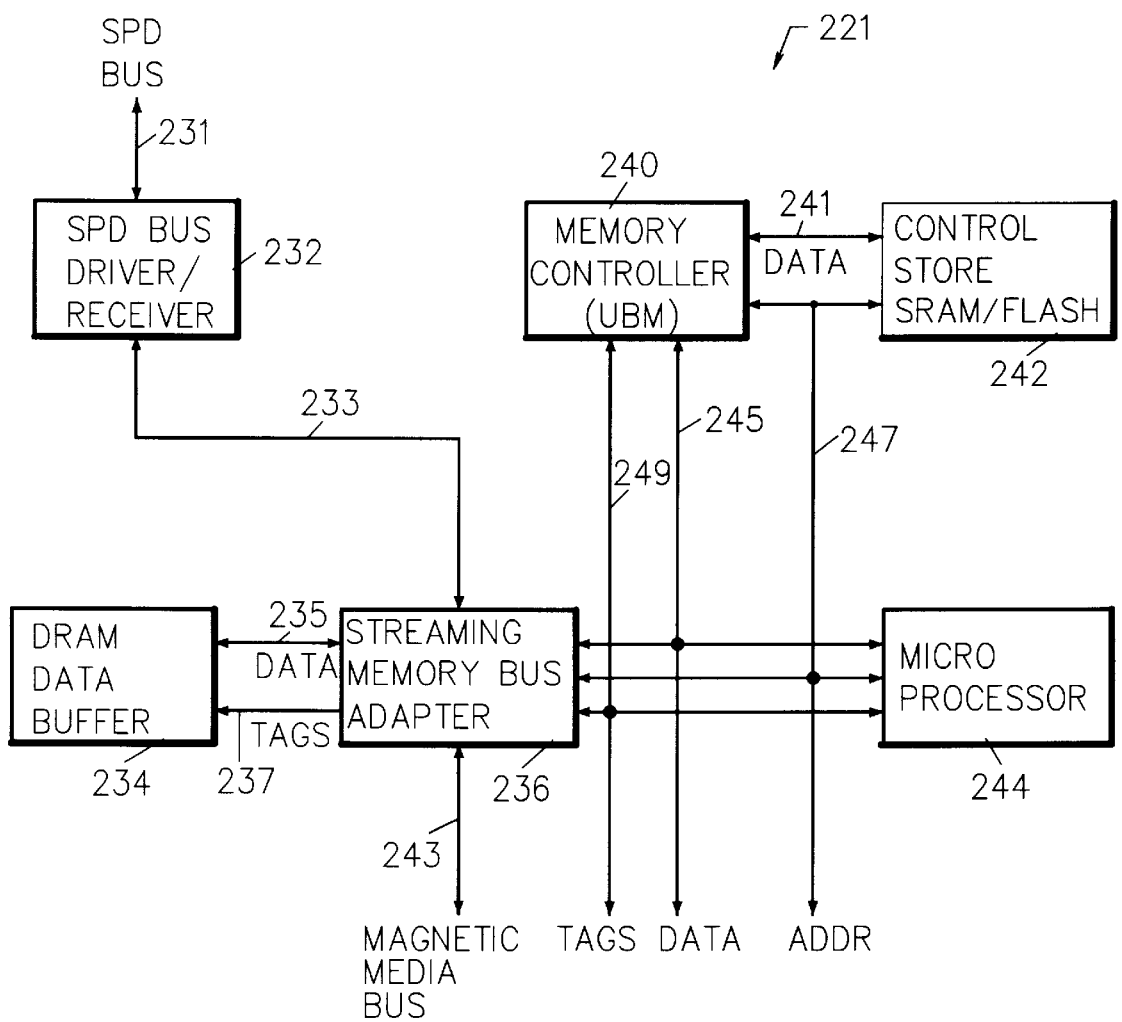
FIG. 5 is a logic diagram of the compression IOP base 221 of FIG. 2.

Referring to FIG. 5, a logic diagram of the compression IOP base 221 of FIG. 1 is set forth. IOP base 221 includes SPD bus driver/receiver 232 which connects streaming memory bus adapter 236 to SPD bus 231 over bus 233 (which is an SPD bus on compression IOP card 220.) Bus adapter 236 interfaces to DRAM data buffer 234 over bidirectional data bus 235 and tags lines 237. Bus adapter 236 interfaces memory controller, or microprocessor bus manager (UBM), 240 and microprocessor 244 over tags lines 249, address bus 247 and data bus 245. Streaming memory bus adapter 236 is the SPD bus interface, a direct memory access (DMA) engine and the interface to magnetic media bus 243. Control store SRAM/flash interfaces to UBM 240 over data bus 241, and UBM 240, microprocessor 244 and bus adapter 236 over address bus 247. Streaming memory bus adapter 236 interfaces control logic 250 (FIG. 6) over magnetic media bus 243. Bus adapter 236 implements, in one exemplary embodiment, 64 paths (0–63) which can support 64 separate DMA type operations on magnetic media bus 243, i.e., adapter 236 can hold DMA parameters for 64 different data transfer operations. Within adapter 236 two separate channels service the paths. Each channel can have one path in active status, and DMA data cycles of an active path on one channel may be interleaved with DMA data cycles on an active path on the other channel without intervening status cycles. A status cycle is used to switch from one path number to another, and also to terminate the operation of a specific path via "done" and "error" indications. Magnetic media bus 243 includes a data bus connected to magnetic media interface 262 and a collection of tags connected to control module, or state machine, 260, including the following signal lines: (a) data 0:15, 16 bidirectional signals forming a halfword of data. Bit 0 is the MSB and bit 15 the LSB; (b) data parity 0:1, two bidirectional signals to provide odd parity for data 0:15, with bit 0 relating to data 0:7 and bit 1 to data 8:15; (c) one DMA request line driven by logic 250/260 for each magnetic media channel; (d) one status select line driven by logic 250/260 for each magnetic media channel; (e) a DMA acknowledge signal driven by adapter 236; a ready signal driven by adapter 236 to indicate which channel the DMA acknowledge applies to, i.e., minus for channel 0 and plus for channel 1.

Microprocessor bus controller (UBM) 240 handles addressing data transfers, provides control signals to and from memory chips 242, and presents data back to 244 on its own bus. Control store 242 is the control store for microprocessor 244. Data buffer 234 stages data for being sent back to host 230 over SPD bus 231, and is the data store for processor 244.

Figure 6:
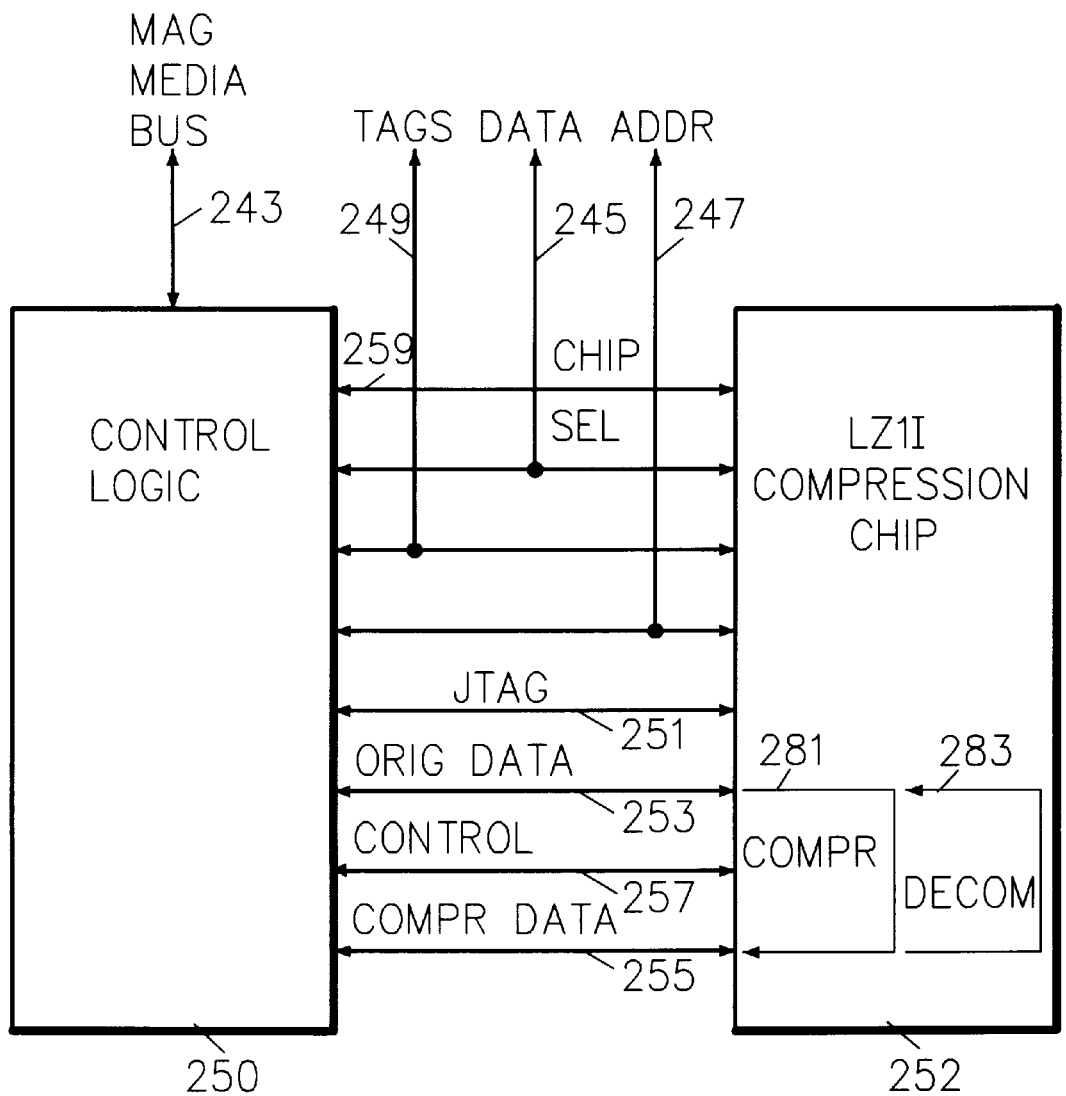
FIG. 6 is a logic diagram of the control logic 250 and LZ1I compression chip 252 of FIG. 2.

Referring to FIG. 6, logic diagram of the control logic 250 and LZ1I compression chip 252 of FIG. 2 is set forth. Control logic 250 interfaces bus adapter 236 over magnetic media bus 243, provides chip select signal line 259 to LZ1I compression chip 252, and interfaces bidirectional busses tags 249, data 245, address 247, JTAG 251, original data 253, compressed data 255, and control 257. Address bus 247 connects to control module 260 as well as to an interface register 268. In accordance with this preferred embodiment, control logic 250 connects the 2-byte wide magnetic media bus 243, which is the main internal data bus of IOP 220, to two 4-byte wide data busses 253 and 255 of compression chip 252. This connection includes handling differences in bus protocol and data rate. Control logic 250 also signals path status on magnetic media bus 243 to streaming memory bus adapter (SMBA) 236 for both outbound and inbound data paths to indicating beginning, ending, and/or error conditions; sends a dummy 16-byte header to SMBA 236 preceeding compressed data; controls two-way data traffic between SMBA 236 and compression chip 252 once the operation has been set up by microcode 244 and the start bit is set in a controls register in interface register 268; provides an address decode of the microprocessor 244 address bus 247 to select compression chip 252; and provides access to JTAG test port 251.

Control logic 250 is, in this preferred embodiment, constructed of vendor components (VTL), including the following. Control module 260 is a programmable logic device (PLD) by Lattice Semiconductor. It contains the state machines and other control logic. FIFO 272 is a pair of MT54C9007 512×9 FIFOs with programmable flags, providing a 512×18 structure to match the 2-byte wide magnetic media bus 243.

LZ1I compression chip 252 receives chip select line 259, and also interfaces bidirectional busses tags 249, data 245, address 247, JTAG 251, original data 253, compressed data 255, and control 257. Compression path 281 represents the compression of original data taken from original data bus 253 and fed to compressed data bus 255. Decompression path 283 represents the decompression of compressed data taken from compressed data bus 255 and fed to original (decompressed) data bus 253. JTAG 251 is an IEEE industry standard signal line for initializing hardware chips (asics), resetting chips, controlling clocks and so forth.

Address bus 247 provides memory address signals driven by microprocessor 244. Bit 31 is the most significant bit (MSB), and bit 2 is the least significant bit (LSB). Address bus 247 address a 4-byte unit on a 4-byte address boundary. LZ1I chip 252 connects only to bits A7:2, and control logic 250 connects only to bits A31:28 and A4:2.

Data bus 245 is a 32-bit wide bidirectional data bus which may be configured by memory region as either a 16-bit or an 8-bit wide bus. Bit 0 is the LSB.

Tags bus 249 includes (a) a write/not read signal driven by microprocessor 244 to signify data direction with respect to microprocessor 244; (b) an address strobe signal driven by microprocessor 244 to signal the start of a new bus cycle, and indicate address time (a valid address on address bus 247); (c) a ready signal driven by the addressed bus unit to indicate that data was accepted (on a write operation), or that data is valid (on a read operation); (d) a burst last signal driven by microprocessor 244 to signify the last data transfer of an operation; this signal is connected only to LZ1I 252, not control logic 250; (e) a data enable signal driven by microprocessor 244 to indicate data cycles (valid data on data bus 245); (f) a processor clock signal driven by microprocessor 244 to provide a timing reference to attached bus units for all inputs and outputs of microprocessor 244; and external interrupt signals received by microprocessor 244 configured to establish dedicated mode with respect to the various bus units (including adapter 236, controller 240, logic 250 and compression chip 252.)

Figure 7:
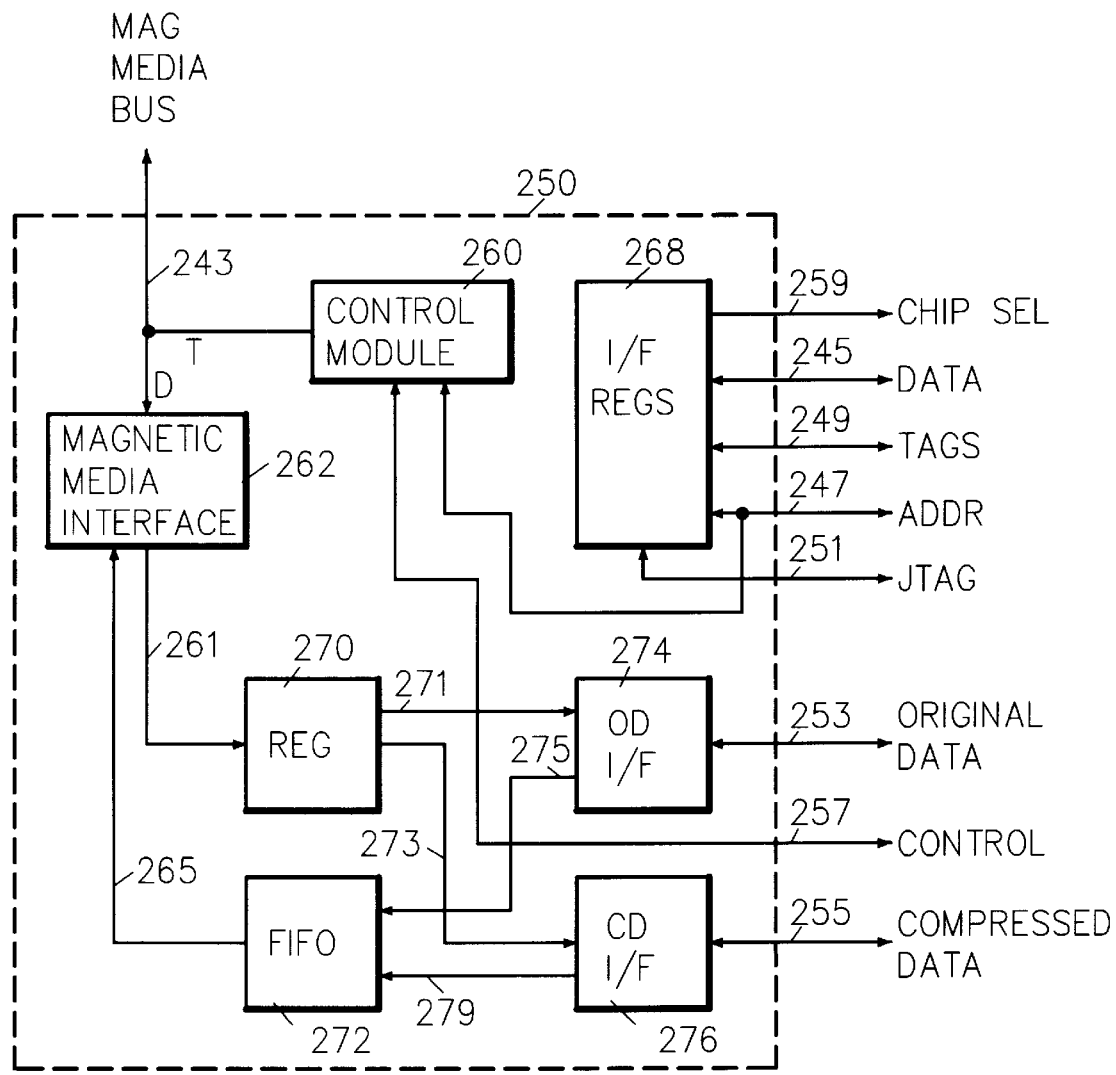
FIG. 7 is a logic diagram in further detail of the control logic 250 of FIG. 2.

FIG. 7 is a logic diagram in further detail of the control logic 250 of FIG. 1. Magnetic media bus 243 is attached to magnetic media interface 262. In this preferred embodiment, magnetic media bus 243 is a 2-byte wide (18 bits), parity checked, bidirectional, synchronous bus that runs at a maximum instantaneous data rate of 40 MB/sec. Data off bus 243 is fed by interface 262 on line 261 to register 270, and thence data for compression is fed on bus 271 to original data interface register 274, and data for decompression is fed on bus 273 to compressed data interface register 276. Data to bus 243 is received by interface 262 on bus 265 from FIFO register 272, which is fed original data (uncompressed or decompressed data) from original data register 274 on bus 275 and compressed data on bus 279 from compressed data interface register 276. Interface register 274 is connected to bidirectional original data bus 253, and interface register 276 is connected to bidirectional compressed data bus 255. Control module 260 is attached to bidirectional control bus 257, and interface registers 268 are provided for interfacing chip select line 259 and bidirectional data busses data 245, tags 249, address 247 and JTAG 251.

Responsive to commands received from main processor 230 control programs 228, auxiliary processor 244 controls the operation of control logic 250 and LZ1I compression chip 252. Control logic 250 is addressable from processor 244 and attached to compression chip 252 by lines 251–257, 249, 245 and 247 for controlling its operation.

Control module 260 includes state machines for sequencing LZ1I compression chip 252, controlling length of data, controlling interface registers 268, 274 and 276, surfacing errors, and so forth.

Compression chip 252 data interfaces, original data 253 and compressed data 255, are each bidirectional and have an uncomplex protocol. A channel write operation loaded to chip 252 register by microprocessor 244 over bus 245 conditions the data flow path 281 from original data bus 253 to compressed data bus 255, and a channel read operation conditions the data flow path 283 from compressed data bus 255 to original data bus 253.

JTAG interface 251 provides an access port to compression chip 252 for test. In this exemplary embodiment, JTAG interface corresponds to IEEE standard 1149.1 "The Test Access Port and Boundary Scan Architecture".

Microcode in the compression IOP implements the compression task which handles the compress and decompress functions from storage management. The compress function is a special command between the system and the compression IOP, with defined header information, data structures and buffer management and handling.

Interface registers 268 include a compression flags register and a compression controls register. In this exemplary embodiment in order to minimize hardware usage and cost, require some bits to be toggled by microcode (microprocessor 244).

Compression flags register in interface registers 268 is a read only register reflecting the state of some control logic 250 elements and compression chip 252 signals. Bits in this register FIFO 272 full or empty, FIFO 272 almost full, FIFO 272 almost empty, path status to signal termination of the operation, path status to signal termination of operation due to an error condition, a sequencer bit indicating that start has been accepted and control logic 250 is running, allowing microcode in processor 244 to reset a sequencer start bit, a JTAG data out from LZ1I bit gated directly to data bus 245 to allow microcode 244 to read serial data from JTAG interface line 251, and a byte enable signal for indicating how many bytes of the last word of a transfer are valid.

Compression controls register, one of interface registers 268, is a write only register which is used to set up and initiate normal compress and decompress operations, and to manipulate the controls for diagnostic operations. It is cleared by power on reset (POR) or unit reset. Compression controls register includes bits for controlling the generation of parity on magnetic media bus 243; a dummy inbound header bit for causing a dummy header of 16 bytes to proceed actual data from compression chip 252 on magnetic media bus 243; a bit for setting diagnostic mode; a bit for enabling FIFO flags register programming via bus 243; a bit for conditioning data paths through compression chip 252 and control logic 250 along paths 281, 283 and through registers 270, 272, 274 and 276 along a compression path or decompression path; a start sequencer bit for signalling state machine 260 to initiate and control a previously set up compress or decompress operation; a program INFIFO enable bit for enabling configuring of inbound FIFO 272 by magnetic media interface 262; a program INFIFO reset bit for resetting inbound FIFO 272 internal pointers and register, and enable programming of the almost full and almost empty flag registers of the FIFO; a JTAG reset latch for retaining the state set by microcode 244; a JTAG test mode select latch for retaining the state set by microcode 244; a JTAG test clock latch for retaining the state set by microcode 244; a JTAG data in to LZ1I for gating serial data from microcode 244 to the JTAG interface to compression chip 252; a pair of byte enable tags for gating by enable latches to the last cycle of outbound data transfers to compression logic 252, for indicating how many bytes of the final word of the total transfer are valid; and an EOP counter register for registering a value indicating the total number of halfwords (16-bit units) to be transferred on the outbound magnetic media path 253 or 255 to the compression chip 252 to be compressed or decompressed.

FIFO 272 is implemented as a pair (high FIFO and low FIFO) of 512×9 FIFOs in parallel to temporarily buffer data on the inbound data path from compression chip 252 to adapter 236 and buffer 234 over magnetic media bus 243. Each FIFO of the FIFO pair 272 includes an almost full flag register and an almost empty flag register. Control module 260 takes data from compression chip 252 as it is made available, and loads it into FIFO 272. When FIFO 272 is loaded to the point where it contains at least the number of words specified by the almost empty flag register of the high FIFO, control module 260 senses the condition, and unloads the data and sends it to magnetic media bus 243 until FIFO 272 contains only the number of words specified by the almost empty flag register of the low FIFO. In most cases, FIFO 272 will not become full, but if it is filled to the point set by the almost full flag register of the low FIFO, control logic 260 will signal compression chip 252 over line 257 to stop sending data to FIFO 272. The almost full signal from the high FIFO is used in combination with the full/empty signal from the low FIFO to indicate whether the FIFO pair 272 is full or empty. When compression chip 252 indicates via an EOP signal that it is sending the last word of data, control 260 transfers whatever data is left in FIFO 272 to magnetic media bus 243, and then sends the done path status.

Figure 8:
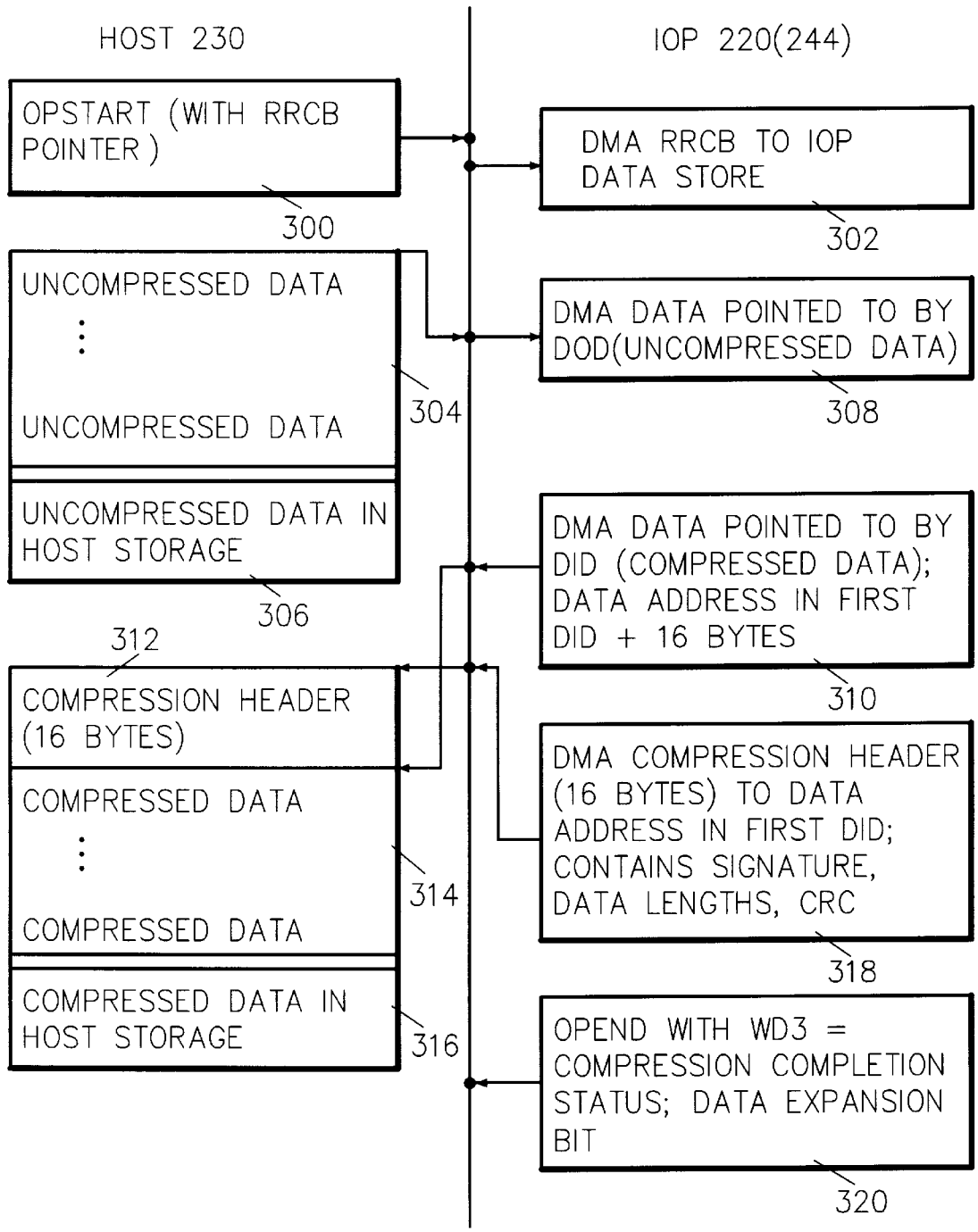
FIG. 8 is a flow diagram of the compression process of the preferred embodiment of the invention.
Figure 9:
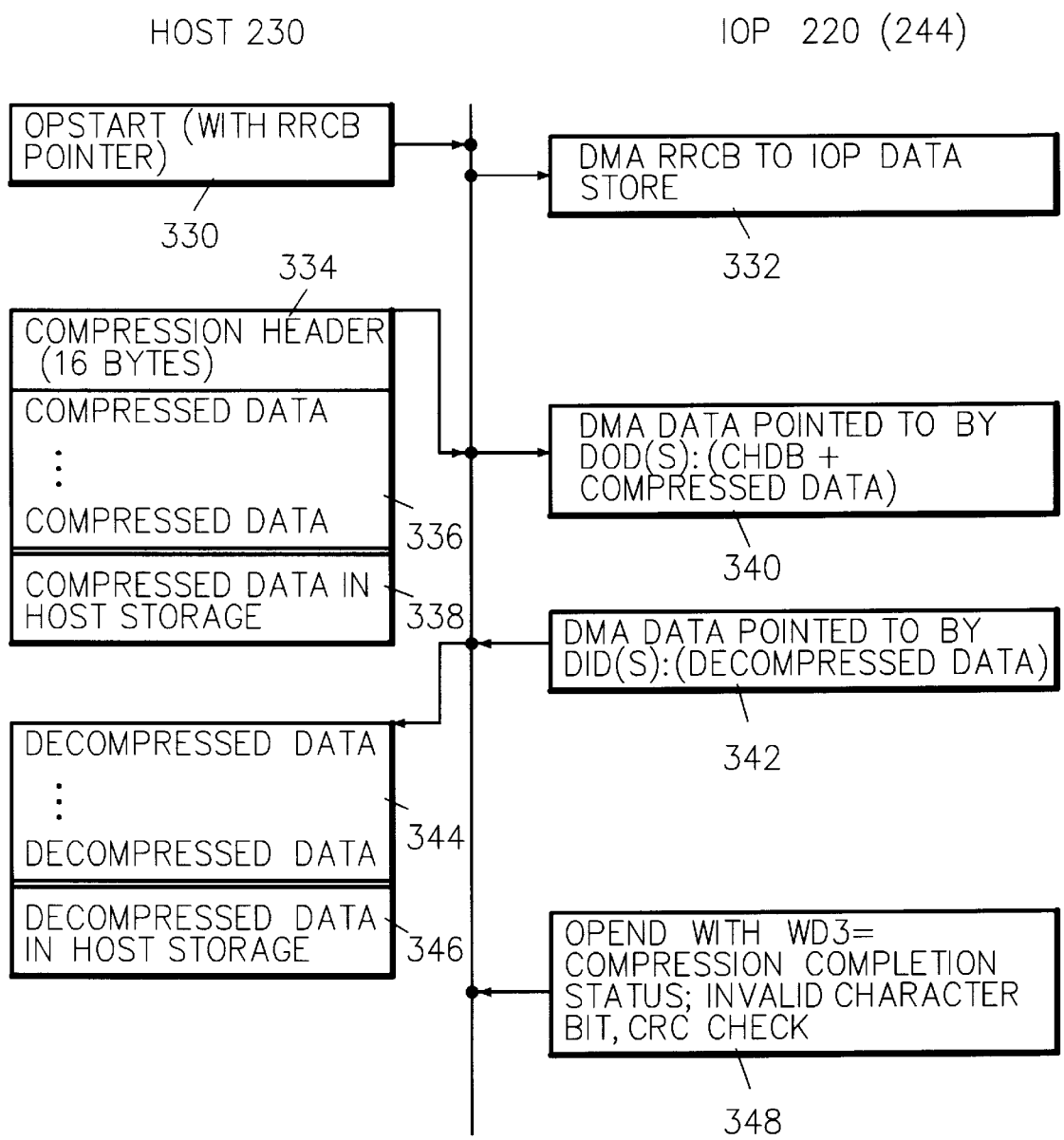
FIG. 9 is a flow diagram of the decompression process of the preferred embodiment of the invention.
Figure 13:
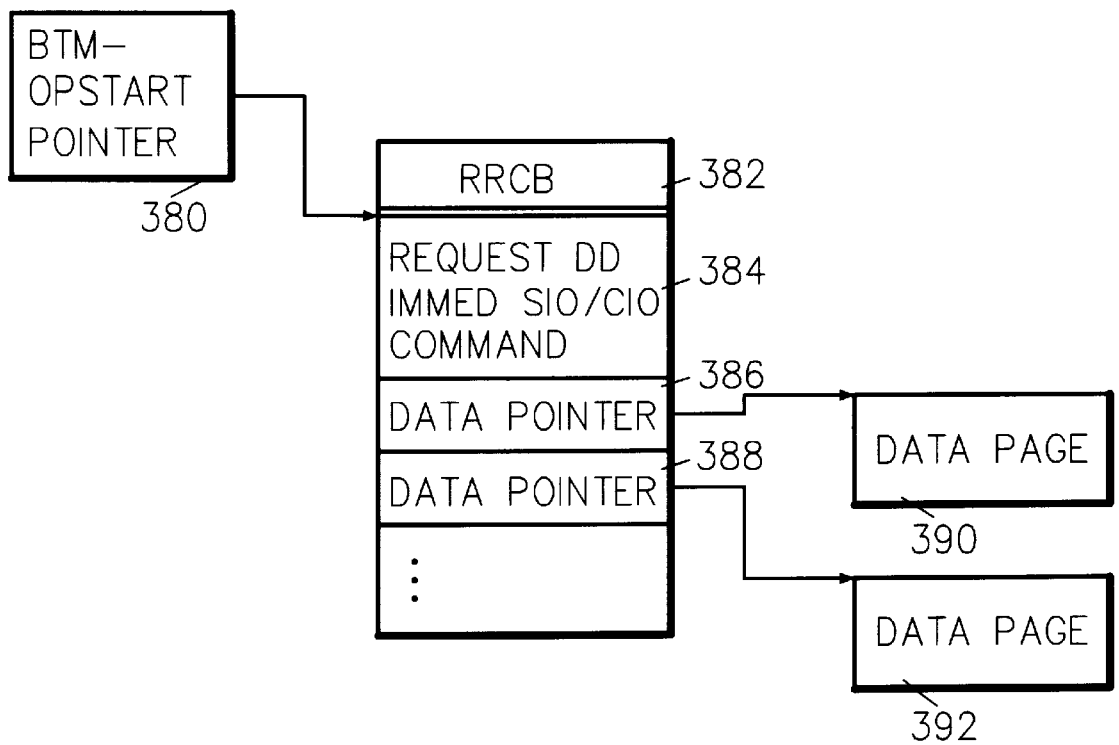
FIG. 13 illustrates the bus transport mechanism (BTM) data structure.

Referring to FIGS. 8, 9 and 13, the compression and decompression methods of the invention are illustrated. From the compression IOP 220 perspective, a compression or decompression operation begins with an OPSTART bus unit message (BUM) 300 or 330, respectively, from host 230 and completes with an OPEND BUM 320 or 348, respectively, from IOP 220 to host 230.

FIG. 13 illustrates the bus transport mechanism (BTM), which is the SPD bus communications facility. It includes data structures bus unit message BUM 380 and request response control block (RRCB) 382, which together contain the command information required to complete the operation of multiple programming functions, such as those executed by microprocessor 244, which IOP 220 DMA's (transfers by direct memory access) from main storage 202 to the IOP data buffer 234 for processing.

Figure 14:
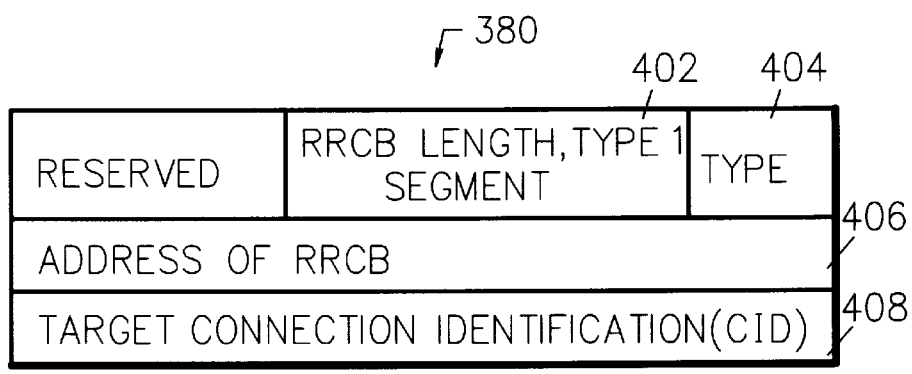
FIG. 14 illustrates the OPSTART bus unit message format.

Referring to FIG. 14, the data structure of the OPSTART bus unit message (BUM) 380 is set forth. OPSTART BUM 380 (generic to OPSTARTs 300 and 330) contains length 402, type 404, target connection identification (CID) 408, and address 406 (or pointer 380) of request response control block (RRCB) 382 in host storage 202. Type 404 indicates whether the IOP is the master or the slave of the DMA, with type X01 indicating master, and type X81 indicating slave.

Request response control block (RRCB) 382 contains a command (immediate SIO/CIO command) in request data descriptor 384 that indicates whether host 230 is requesting data to be compressed or decompressed. RRCB 382 also includes data pointers 386, 388 to data pages 390, 392 in storage 202 which contain the data to be compressed or decompressed. DODs 356, 366 and DIDs 358, 368 each comprise one or more data pointers 386, 388. In accordance with this embodiment of the invention, a compressed data area in host storage 202 contains a compression header data block (CHDB) 140 (16 bytes) followed by the actual compressed data.

Figure 10:
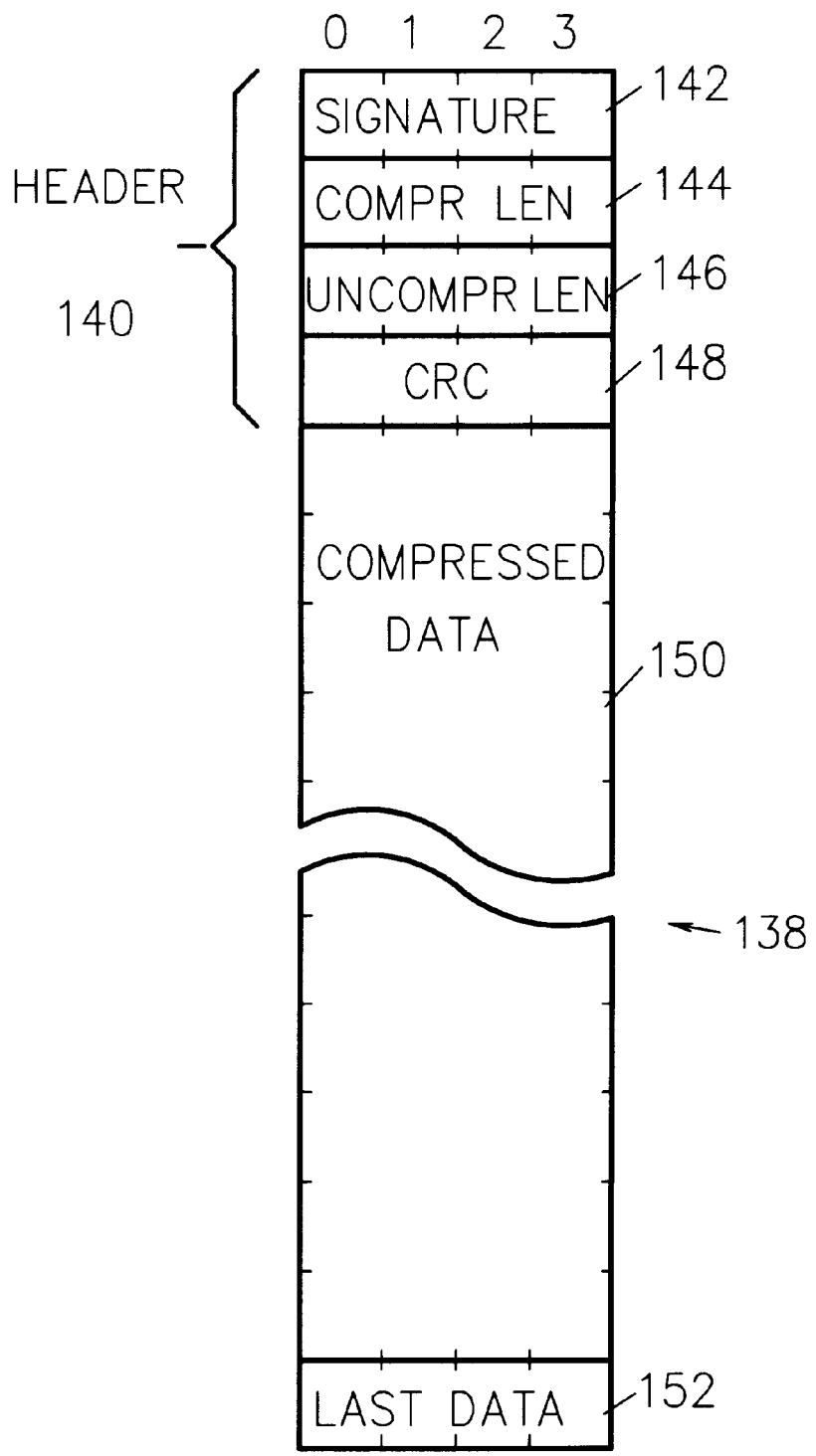
FIG. 10 illustrates the format of a compressed data block.

Referring to FIG. 10, the format of compression header data block (CHDB) 138 is set forth. CHDB 138 includes header 140 and compressed data 150, 152. In accordance with this embodiment, block 138 always begins on a 4-byte address boundary and consists of a 16-byte header 140 followed by a variable length compressed data string 150, 152. Header 140 is made up of a 4-byte signature 142, a 4-byte compressed data length field 144, a 4-byte uncompressed data length field 146, and a 4-byte cyclic redundancy check (CRC) word. The actual compressed data 150 begins on a 4-byte address boundary, but last data 152 may end on any byte boundary. In this embodiment, the total length of compressed data block 138 may not exceed 128K bytes.

Object header 140 is not compressed, as it is referenced and modified by segment and management operations which must work whether the data portion of the object is compressed or not and whether or not the object is page aligned. Thus, in accordance with this preferred embodiment of the invention, the compression method of the invention works with objects types previously compressed with software and which, therefore, do not have page alignment.

Signature 142 is a unique 4-byte value which identifies various characteristics of compressed data block 138 such as the type of compression algorithm and history buffer size.

Compressed data length 144 specifies the exact length of the compressed data 150, 152 (not including header 140).

Uncompressed data length 146 specifies the exact length of the original data block before it was compressed and, of course, the length of the data block after it is decompressed.

Cyclic redundancy check (CRC) word 148 is a 4-byte value generated from the original, uncompressed data by applying, for example, a polynomial algorithm. (In one embodiment, this polynomial is implemented by the LZ1I chip design.) On a decompress operation, the uncompressed data is used to generate a CRC which must be identical to the original data CRC 148 for the decompress operation to successfully complete.

Figures 11, 12:
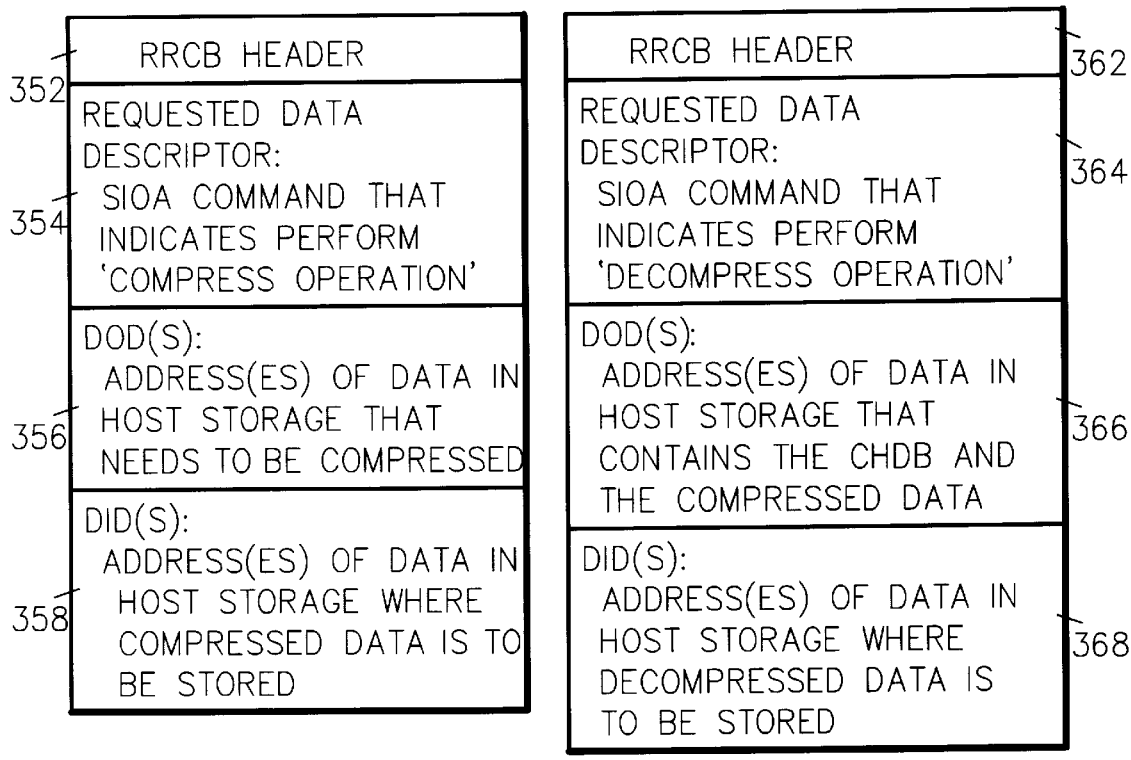
FIG. 11 illustrates the format of the compression control block.
FIG. 12 illustrates the format of the decompression control block.

Referring to FIG. 11, compression RRCB 350 is an RRCB 382 including a header 352 and a data descriptor 354 with an SIOA command that indicates perform compress operation. In this case, data pointers 386 and 388 comprise data out descriptors (DODs) 356 and data in descriptors (DIDs) 358, respectively. DODs 356 provide addresses of data in host storage 202 that need to be compressed and DIDs 358 provide addresses in host storage 202 where compressed data is to be stored.

Referring to FIG. 12, decompression RRCB 360 is an RRCB 382 including a header 362 and a data descriptor 364 with an SIOA command that indicates perform decompress operation. In this case, data pointers 386 and 388 comprise DODs 366 and DIDs 368, respectively. DODs 366 provide addresses of data in host storage 202 that contain compression header data block (CHDB) 138 (FIG. 10) and compressed data and DIDs 368 provide address in storage 202 where decompressed data is to be stored.

Referring further to FIG. 8 in connection with FIG. 13, for compression, in step 300, host 230 sends OPSTART to IOP 220. In step 302, IOP 220 (under control of code executed by processor 244) retrieves by direct memory access (DMA) the RRCB 350 from storage 202 at the location pointed to by OPSTART pointer 380 and loads it to IOP data store 234. In step 308, IOP 220 DMA retrieves uncompressed data 306 from host storage 202 pointed to by DOD 356. IOP 220 then utilizes compression hardware 252 to compress uncompressed data 304, and in step 310, IOP 220 DMA loads compressed data 314 to the location 316 in main storage 202 addressed by DID 358. In step 318, IOP 220 DMA loads compression header 140 to the main storage 202 address pointed to by the first DID 358 once all of the compressed data 314 has been stored into host storage 202. Thereafter, upon completion of DMA storage of header 312 and data 314, in step 320 IOP 220 issues OPEND BUM to host 230 signaling completion of the compression operation.

Thus, uncompressed or decompressed data to be compressed follows the following data path: storage 202 at the location 306 defined by DOD 356, thence over busses 213, 231 233 and 235 to data buffer 234, thence over busses 235, 243 and 261 to register 270, thence over bus 271 to original data bus 253, thence through compression path 281 of LZ1I compression chip 252 and on compressed data bus 255 to compressed data interface register 276, thence over busses 279, 265, 243 and 235 to data buffer 235, and thence over busses 235, 233, 231 and 213 to the locations 316 in host storage 202 addressed by DIDs 358.

Referring further to FIG. 9 in connection with FIG. 12, for decompression, in step 330 host 230 issues the OPSTART command to IOP 220 with pointer 380 addressing RRCB 360. In step 332, IOP 220 DMA accesses the RRCB in storage 202 at the address provided by pointer 380, and loads it into data buffer 234. In step 340, IOP 220 DMA accesses compression header (CHDB) 334 and compressed data 336 from storage 202 at the address locations provided by DODs 366, and loads them into data buffer 234. IOP 220 then utilizes LZ1I compression chip 252 (path 238) to decompress the data, which loaded into data buffer 234. In step 342, IOP 220 DMA loads the decompressed data from data buffer 234 as decompressed data 344 into the host storage at the address location 346 pointed to by DIDs 368 from RRCB 360.

Thus, compressed data to be decompressed follows the following path: storage 202 at the location defined by DOD 366, buses 213, 231, 233 and 235 to buffer 234; buses 235, 243 and 261 to register 270; bus 273 to compressed data interface register 276, compressed data bus 255 to the decompression path 283 through LZ1I compression chip 252 and thence on original data bus 253 to original data interface register 274, thence on bus 275 to FIFO 272, on busses 265, 243 and 235 to data buffer 234, and thence over busses 235, 233, 231 and 213 to the locations 346 in storage 202 addressed by DIDs 368.

Microprocessor 244 in conjunction with control microcode resident in control store 242 sets up the appropriate direct memory access (DMA) and compression hardware 221, 250 and 252, enables the compress/decompress operation, initiates hardware operations and monitors for exceptions. Additionally, the compression task tests the hardware at power-on time, initializes the hardware, and retries or resolves all exception conditions.

In a preferred embodiment of the invention, the AS/400 CPROBJ and DCPOBJ system commands are expanded to support compression of data base files as a new object type, via a new member (MBR) keyword used to identify objects which are databases. At the machine interface (MI), new compress and decompress modification requests are supported for data spaces. VMC database also supports implicit decompression of discrete 16 MB portions of a data space on first reference. Decompressing the referenced portions of a large file is important for an archival type of file where only the more recently added information is likely to be referenced. Accessing the first part of large spool files for a display function allows the user to look at only the first page to identify what report it is, as is illustrated in FIG. 4, by step 124 starting at time 123 after the first 16 MB segment has been read in step 122. In FIG. 4, time 132 occurs after step 128 writes the compressed 16 MB block read at time 123. Referencing the first 16 MB of a large file reduces the response time to access a compressed file, for the user need only wait to time 127 for 16 MB to be decompressed.

Advantages over the Prior Art

It is an advantage of this invention that it provides a method for accomplishing minimal access penalties for storage of large data sets. Further, as processors become smaller, faster and less expensive, a larger portion of the total system cost comes from storage elements. The resulting efficient use of compression capability, therefore, greatly reduces overall system cost.

It is a further advantage of this invention that dedicated I/O processor and software provide data throughput improvements via hardware compression capabilities required to enhance and extend compression to database, office, and spool files.

It is a further advantage of this invention that users are provided the option of compressing infrequently accessed datasets, thus gaining additional DASD space.

It is a further advantage that overall compression performance achievable with the compression I/O processor achieves an order of magnitude better performance over a software only technique.

It is a further advantage that increased storage capacity is provided without requiring additional DASD, resulting in a system cost advantage while assuring reasonable access to compressed objects and data bases.

It is a further advantage of the invention that existing and new users (such as VMC/DB) may continue using existing support, including COMPRESS and DECOMPRS macros, to perform compress/decompress operations and the hardware comprising this invention is used if available transparently to the user, except for improved performance.

Further advantages of this invention include providing an aging algorithm whereby compressed data is introduced into the storage hierarchy model, compression by segment, decompression on demand by segment, the concept of data life cycle, and use of compression accelerator hardware without disk access.

Alternative Embodiments

It will be appreciated that, although specific embodiments of the invention have been described herein for purposes of illustration, various modifications may be made without departing from the spirit and scope of the invention. In particular, it is within the scope of the present invention to combine the various hardware elements of IOP's 220 and 222 into a single IOP, thus achieving potential buffer efficiencies.

Accordingly, the scope of protection of this invention is limited only by the following claims and their equivalents.

We claim:

1. Method for managing data objects in a system including a central processor, a main storage, a remote storage, and a compression input/output processor, comprising the steps of:

responsive to a system managed aging algorithm, compressing an uncompressed data object according to the steps of:
reading said uncompressed data object from remote storage into main storage;
loading into said main storage a compression control block, said compression control block including a compression start I/O operation command, a data out descriptor giving the address in main storage of said uncompressed data object, and a data in descriptor giving the address in main storage into which a resulting compressed data object is to be stored;
responsive to said compression start I/O operation command, writing said compression control block to said compression input/output processor;
operating said compression input/output processor to (a) load said uncompressed data object to said compression input/output processor from the main storage location addressed by said data out descriptor, (b) compress said uncompressed data object, and (c) load the resulting compressed data object to the main storage location addressed by said data in descriptor; and
writing said compressed data object to said remote storage from said main storage; and responsive to an application request for access to a compressed data object, decompressing said compressed data object according to the steps of:
reading said compressed data object from remote storage into main storage;
loading into said main storage a decompression control block, said decompression control block including a decompression start I/O operation command, a data out descriptor giving the address in main storage of said compressed data object, and a data in descriptor giving the address in main storage into which a resulting decompressed data object is to be stored;
responsive to said decompression start I/O operation command, writing said decompression control block to said compression input/output processor;
operating said compression input/output processor to (a) load said compressed data object to said compression input/output processor from the main storage location addressed by said data out descriptor, (b) decompress said compressed data object, and (c) load the resulting decompressed data object to the main storage location addressed by said data in descriptor;
writing said decompressed data object to said remote storage from said main storage; and
granting said application request.

2. System for controlling compression and decompression of data objects, comprising:
a host processor;
a main storage;
a remote storage;
a compression input/output processor (IOP);
said host processor being operable for storing in said main storage a bus transport mechanism (BTM) including an operation command, a data out descriptor (DOD) for addressing the location in said main storage of data that needs to be compressed or decompressed, and a data in descriptor (DID) for addressing the location in said main storage where the resulting decompressed or compressed data is to be stored;
said compression IOP being operable for reading said BTM and executing said command selectively to compress or decompress data stored in said main storage and return the resulting compressed or decompressed data to said main storage;
said host processor being further operable for initiating the transfer of compressed and uncompressed data between said main storage and remote storage.

3. System for controlling modification of a data object, comprising:

a host processor;

a main storage;

a remote storage;

a data modification input/output processor (IOP);

said host processor being operable for storing in said main storage a bus transport mechanism (BTM) including a modification operation command, a data out descriptor (DOD) for addressing the location in said main storage of a data object that needs to be modified, and a data in descriptor (DID) for addressing the location in said main storage where the resulting modified data object is to be stored;

said modification IOP being operable for reading said BTM and executing said modification command to modify the data object addressed by said DOD and return the resulting modified data object to the location in said main storage addressed by said DID;

said host processor being further operable for initiating the transfer of modified and unmodified data objects between said main storage and remote storage.

4. The system of claim 3 wherein said data modification command is a data compression or data decompression command.

5. The system of claim 3 wherein said modification command is initiated responsive to a system executed algorithm.

6. The system of claim 5 wherein said system executed algorithm comprises time since creation or modification of said data object.

7. The system of claim 3 wherein said data object is divided into subcomponents and said data object modification is executed with respect to said subcomponents.

8. The system of claim 3, said data modification IOP further comprising:

a processor;

a streaming bus adapter and data buffer;

a data modification circuit; and a control module;

said processor being operable for controlling said streaming bus adapter and data buffer to transfer data objects between said control module and said main storage;

said control module being operable for transferring data objects between said data modification circuit and said streaming bus adapter and data buffer;

said data modification circuit being operable responsive to said data modification command for modifying said data object.

9. The system of claim 8, said data modification command selectively commanding the compression or decompression of said data object.

* * * * *